US012621589B2

(12) United States Patent
Austin et al.

(10) Patent No.: US 12,621,589 B2
(45) Date of Patent: *May 5, 2026

(54) SELF-TUNING CURRENT TRANSFORMER

(71) Applicant: Vutility, Inc., Sandy, UT (US)

(72) Inventors: Micheal M. Austin, South Jordan, UT (US); Kody Shook Brown, West Jordan, UT (US)

(73) Assignee: Vutility, Inc., Sandy, UT (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/742,296

(22) Filed: Jun. 13, 2024

(65) Prior Publication Data

US 2024/0414457 A1      Dec. 12, 2024

Related U.S. Application Data

(63) Continuation of application No. 17/949,070, filed on Sep. 20, 2022, now Pat. No. 12,035,086.

(Continued)

(51) Int. Cl.
| | |
|---|---|
| *H04Q 9/00* | (2006.01) |
| *G08C 19/00* | (2006.01) |
| *H03M 1/06* | (2006.01) |

(52) U.S. Cl.
CPC .............. *H04Q 9/00* (2013.01); *G08C 19/00* (2013.01); *H03M 1/0617* (2013.01); *H04Q 2209/60* (2013.01)

(58) Field of Classification Search
CPC ........... H04Q 2209/00; H04Q 2209/10; H04Q 2209/20; H04Q 2209/40; H04Q 2209/43;
(Continued)

(56) References Cited

U.S. PATENT DOCUMENTS

| | | | |
|---|---|---|---|
| 5,583,837 A | 12/1996 | Ogino et al. | |
| 6,229,467 B1 * | 5/2001 | Eklund | H03M 1/1042 |
| | | | 341/120 |

(Continued)

FOREIGN PATENT DOCUMENTS

| | | |
|---|---|---|
| KR | 10-2016-0150156 A | 12/2016 |
| WO | WO-2016/028710 A1 | 2/2016 |

OTHER PUBLICATIONS

International Search Report and Written Opinion dated Dec. 28, 22 for international application PCT/US2022/044147.

(Continued)

*Primary Examiner* — Franklin D Balseca
(74) *Attorney, Agent, or Firm* — Foley & Lardner LLP

(57) ABSTRACT

An electricity usage monitor may include a coupling component to attach the electricity usage monitor to an electrical circuit to monitor electricity usage of the electrical circuit, an analog-digital converter (ADC) configured to convert analog current readings captured by the electricity usage monitor into digital values, a processor operably coupled to the ADC, and a non-transitory, computer-readable medium operably coupled to the processor and comprising instructions which, when executed by the processor, cause the processor to perform operations. The operations may include determining a standard deviation of the digital values, based on the standard deviation, adjusting a gain of the ADC, and transmitting a signal to a server comprising the digital values.

20 Claims, 10 Drawing Sheets

800 ⤏

810 Determine a standard deviation of measurements captured by an electricity usage monitor 820 Based on the standard deviation of the measurements, adjust a gain of an analog-digital converter (ADC)

830 Transmit a signal to a server comprising digital values generated by the ADC, wherein the digital values comprise digital conversions of the measurements

Related U.S. Application Data

(60) Provisional application No. 63/261,401, filed on Sep. 20, 2021.

(58) Field of Classification Search
CPC .......... H04Q 2209/60; H04Q 2209/70; H04Q 2209/80; H04Q 2209/82; H04Q 2209/826; H04Q 9/00; G08C 19/00; H03M 1/0617
See application file for complete search history.

(56) References Cited

U.S. PATENT DOCUMENTS

| | | | |
|---|---|---|---|
| 8,860,590 B2 | 10/2014 | Yamagata et al. | |
| 9,466,417 B2 | 10/2016 | Jefferies et al. | |
| 9,774,343 B1 * | 9/2017 | Liaghati | H03M 1/186 |
| 11,754,997 B2 * | 9/2023 | Engelstein | H04Q 9/00 |
| | | | 700/291 |
| 11,991,490 B2 | 5/2024 | Austin et al. | |
| 2003/0048199 A1 | 3/2003 | Zigdon et al. | |
| 2012/0191395 A1 | 7/2012 | Bandsmer | |
| 2013/0338949 A1 | 12/2013 | Jetcheva et al. | |
| 2014/0361908 A1 | 12/2014 | Laird et al. | |
| 2015/0372539 A1 | 12/2015 | Livadaras et al. | |
| 2018/0034657 A1 | 2/2018 | Brown et al. | |

| | | |
|---|---|---|
| 2019/0101576 A1 | 4/2019 | Sharp et al. |
| 2019/0122132 A1 | 4/2019 | Rimini et al. |
| 2020/0285983 A1 | 9/2020 | Bhattacharyya |
| 2020/0374605 A1 | 11/2020 | Snook et al. |

OTHER PUBLICATIONS

Karlsson, Power Transformer Monitoring and Diagnosis using Transformer Explorer, Thesis [online], Mar. 2016 [retrieved Dec. 5, 2022]. Entire Document. Retrieved from the Internet: URL: https://www.diva-portal.org/smash/get/diva2:912439/FULLTEXT01.pdf.

PCT International Search Report and Written Opinion, Apr. 13, 2023,.

Extended European Search Report dated Sep. 8, 2025, for EP22879837.6.

Tong Xing et al: "Smart Metering Load Data Compression Based on Load Feature Identification", IEEE Transactions on Smart Grid, IEEE, USA, vol. 7, No. 5, Sep. 1, 2016, pp. 2414-2422, XP011620727.

Extended European Search Report dated Jun. 5, 2025, for EP22870857.4.

Karlsson Svante: "Power Transformer Monitoring and Diagnosis using Transformer Explorer" In: "Thesis", Jan. 1, 2016, Uppsala universitet, Institutionen f?r teknikvetenskaper, Sweden, XP093049614, pp. 1-71.

* cited by examiner

| Bucket | Amps |
|--------|-------|
| 1 | 1.212 |
| 2 | 2.424 |
| 3 | 3.636 |
| 4 | 4.848 |
| 5 | 6.061 |
| 6 | 7.273 |

| | |
|--------|-------|
| 3295 | 3993.939 |
| 3296 | 3995.152 |
| 3297 | 3996.364 |
| 3298 | 3997.576 |
| 3299 | 3998.788 |
| 3300 | 4000.000 |

400

410     450

| Bucket | Amps |
|--------|------|
| 1 | 0.030 |
| 2 | 0.061 |
| 3 | 0.091 |
| 4 | 0.121 |
| 5 | 0.152 |
| 6 | 0.182 |

411 412 413 414 415 416

451 452 453 454 455 456

| 3295 | 99.848 |
| 3296 | 99.879 |
| 3297 | 99.909 |
| 3298 | 99.939 |
| 3299 | 99.970 |
| 3300 | 100.000 |

425 426 427 428 429 430

465 466 467 468 469 470

500

510          550

| Bucket | Amps |
|--------|------|
| 1 | 1.818 |
| 2 | 3.636 |
| 3 | 5.455 |
| 4 | 7.273 |
| 5 | 9.091 |
| 6 | 10.909 |

511
512
513
514
515
516

551
552
553
554
555
556

| 3295 | 5990.909 |
| 3296 | 5992.727 |
| 3297 | 5994.545 |
| 3298 | 5996.364 |
| 3299 | 5998.182 |
| 3300 | 6000.000 |

525
526
527
528
529
530

565
566
567
568
569
570

600

610

650

| Bucket | Amps |
|--------|--------|
| 1 | 2000.000 |
| 2 | 2000.606 |
| 3 | 2001.212 |

611 651
612 652
613 653

| 1648 | 2998.788 |
| 1649 | 2999.394 |
| 1650 | 3000 |
| 1651 | 3000.606 |
| 1652 | 3001.212 |

614 654
615 655
616 656
617 657
618 658

| 3298 | 3999.394 |
| 3299 | 4000.000 |
| 3300 | 6000.000 |

628 668
629 669
630 670

810 Determine a standard deviation of measurements captured by an electricity usage monitor 820 Based on the standard deviation of the measurements, adjust a gain of an analog-digital converter (ADC)

830 Transmit a signal to a server comprising digital values generated by the ADC, wherein the digital values comprise digital conversions of the measurements

800

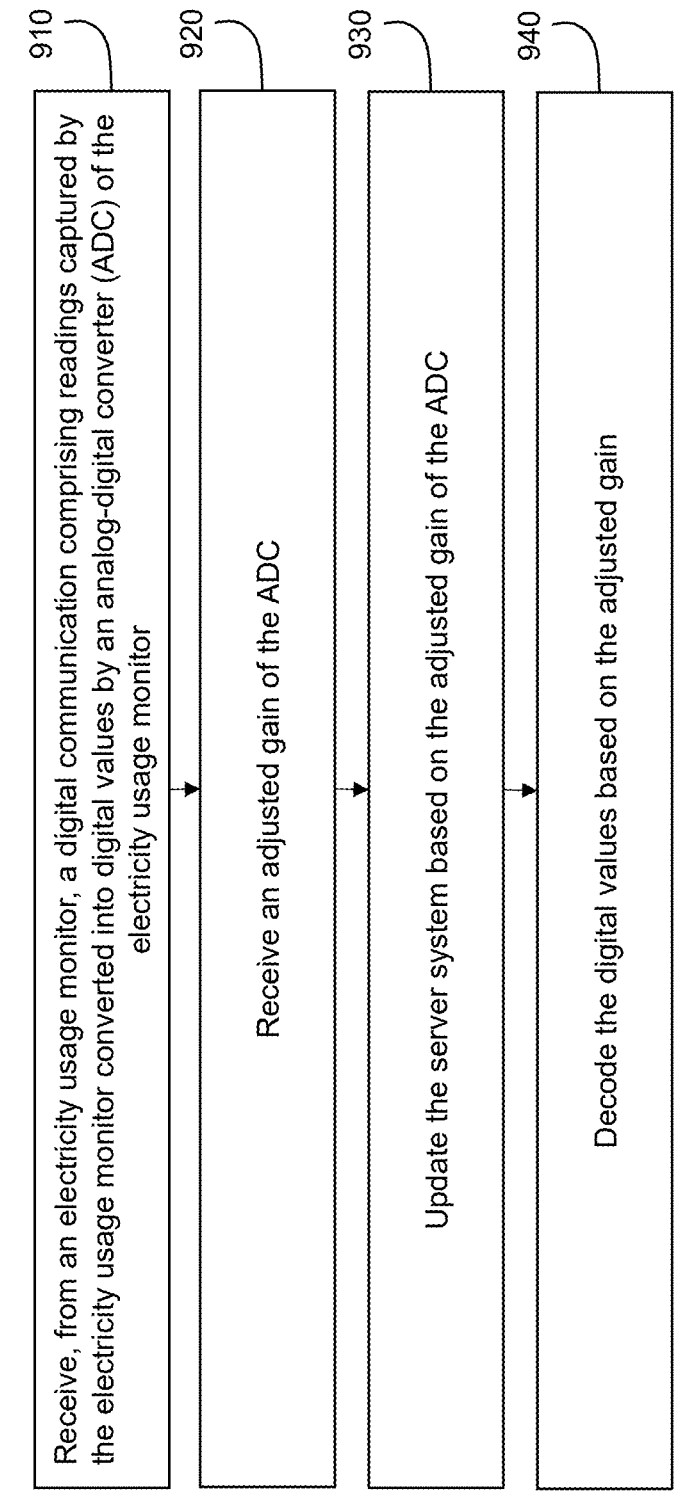

900

910 Receive, from an electricity usage monitor, a digital communication comprising readings captured by the electricity usage monitor converted into digital values by an analog-digital converter (ADC) of the electricity usage monitor 920 Receive an adjusted gain of the ADC 930 Update the server system based on the adjusted gain of the ADC 940 Decode the digital values based on the adjusted gain

FIG. 9

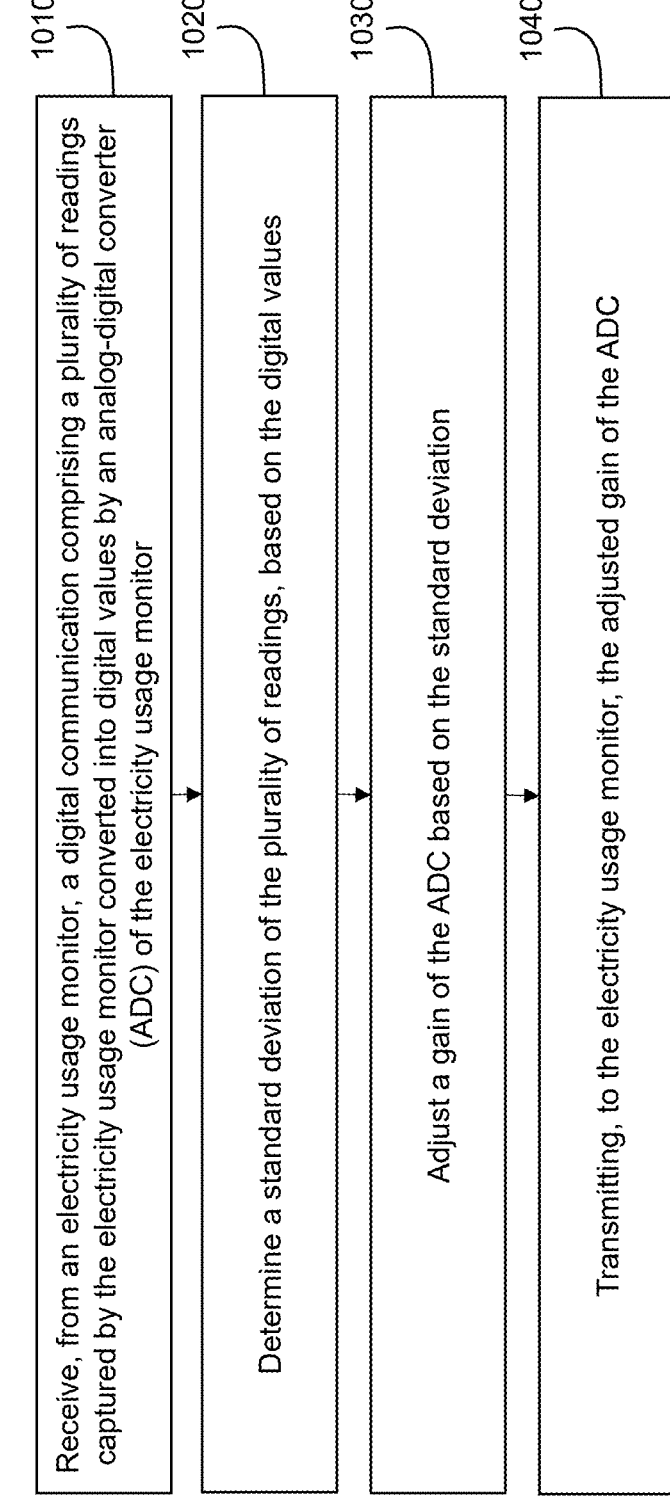

1000

1010 Receive, from an electricity usage monitor, a digital communication comprising a plurality of readings captured by the electricity usage monitor converted into digital values by an analog-digital converter (ADC) of the electricity usage monitor 1020 Determine a standard deviation of the plurality of readings, based on the digital values 1030 Adjust a gain of the ADC based on the standard deviation 1040 Transmitting, to the electricity usage monitor, the adjusted gain of the ADC

FIG. 10

SELF-TUNING CURRENT TRANSFORMER

RELATED APPLICATIONS

This application is a continuation of U.S. patent application Ser. No. 17/949,070, entitled SELF-TUNING CURRENT TRANSFORMER, filed Sep. 20, 2022, which claims priority to U.S. Provisional Application No. 63/261,401, entitled RELATIVE ADAPTIVE DECODING OR SELF-TUNING CURRENT TRANSFORMER, filed Sep. 20, 2021, each of which is incorporated herein by reference in its entirety.

TECHNICAL FIELD

The present disclosure is directed to methods and devices that measure electrical properties of a conductor and report those measurements, and more particularly to monitoring methods and devices that self-tune to enhance resolution of measurement reporting.

BACKGROUND

Monitoring electricity usage can provide better information about energy consumption to help manage critical assets, mitigate unnecessary energy or equipment loss, and improve overall efficiencies (saving money and conserving valuable resources). Monitoring electricity can also facilitate understanding and insights of energy consumption by different portions of a given electrical system (e.g., individual units of a multi-unit apartment complex). The enhanced information obtained through monitoring electricity usage can enhance decision making. Better information can improve decisions.

Electricity monitoring devices that communicate monitoring information (measurement information) wirelessly and/or over a communication network such as the Internet can significantly enhance available information. The proliferation of the Internet-of-Things (IOT) has included proliferation of such electricity monitoring devices that communicate monitoring information wirelessly.

In order to transmit an electrical measurement, an electrical monitoring device may utilize an analog-to-digital converter (ADC) to convert the analog reading to a digital value.

BRIEF DESCRIPTION OF THE DRAWINGS

FIG. 9 is a flowchart illustrating a process for monitoring electricity, according to another embodiment.

FIG. 10 is a flowchart illustrating a process for adjusting a gain of an ADC of an electricity usage monitor, according to another embodiment.

DETAILED DESCRIPTION

Active electrical monitoring requires less than 2% error in order to be "revenue grade." Reporting accuracy at this level usually requires high precision data with numbers represented with multiple positions beyond the decimal point (for KW or KWh). Devices according to the present disclosure and/or devices implementing methods according to embodiments of the present disclosure can measure Amp-hour data in nano-Amp-hours and milli-Amp-hours across a wide range of current values. For example, an electricity monitoring device may be capable of measuring current from 0 to 4000 amps. However, covering such a large range of current values may result in coarse measurements.

The present disclosure is directed to devices, methods, and techniques to automatically tune an electricity monitoring device to provide accurate current measurements with fine granularity, and to do so across a wide range of current values.

Figure 1:
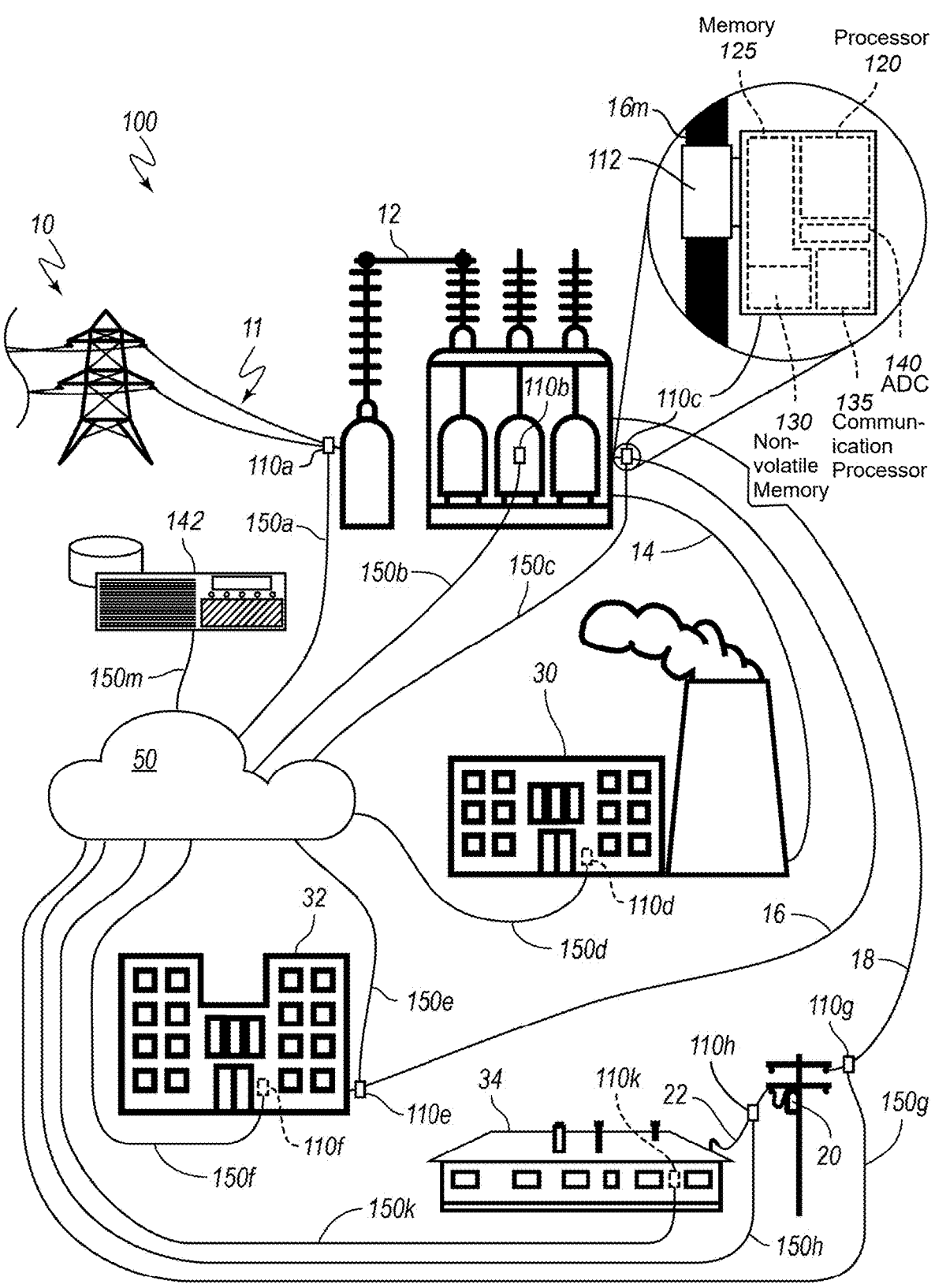
FIG. 1 depicts an electrical system including electrical monitoring, in accordance with one or more embodiments.

FIG. 1 depicts an electrical system 100 including electrical monitoring, in accordance with one or more embodiments. The electrical system 100 may include or otherwise involve an electrical grid 10. A station 12 (e.g., a substation) interconnects to the electrical grid 10 at one or more electrical mains 11. The station 12 provides utility electricity service to one or more consumers (e.g., customers), such as an industrial consumer 30, a commercial or high-density residential consumer 32, and/or a residential consumer 34, via service lines 14, 16, 18. (A transformer 20 may be interposed to step down a voltage on service line 18 for delivery over a service drop line 22 to the residential consumer 34).

Electricity monitoring devices 110a, 110b, 110c, 110d, 110e, 110f, 110g, 110h, 110k (collectively electricity monitoring devices 110a-k) may be positioned at various points throughout the system 10 to monitor electricity at those various points of the system 10. As shown slightly enlarged in FIG. 1, an electricity monitoring device 110c may include a coupling 112 (e.g., a split core current transformer to couple to a monitored service line 16m), a processor 120, memory 125, non-volatile memory 130, a communication processor 135 (e.g., a communication network interface, an analog-digital converter (ADC) 140, a wireless communication network transmitter/transceiver), and an energy storage device to store harvested energy and to release the stored energy to power the processor 120, communication processor 135, and/or other components of the monitoring device 110c. The ADC 140 may have a variable gain. The processor 120 may be configured to adjust the gain of the ADC 140. The electricity monitoring devices 110a-k may be in communication with an electronic communication network 50, such as a wireless communication network (e.g., WiFi, LoRaWAN, SigFox IoT), a cloud computing network or system, and/or the Internet. A server system 142 may also be in communication with the communication network 50.

The electricity monitoring devices 110a-k can provide data transmissions or communications 150a, 150b, 150c, 150d, 150e, 150f, 150g, 150h, 150k, 150m (collectively communications 150a-m) to the communication network that can be received by the server system 142. The data can include measurement data. The devices 110a-k may include self-tuning current monitoring devices. Each self-tuning current monitoring device may adjust the gain of the ADC based on current measurements, as discussed herein.

Figure 2:
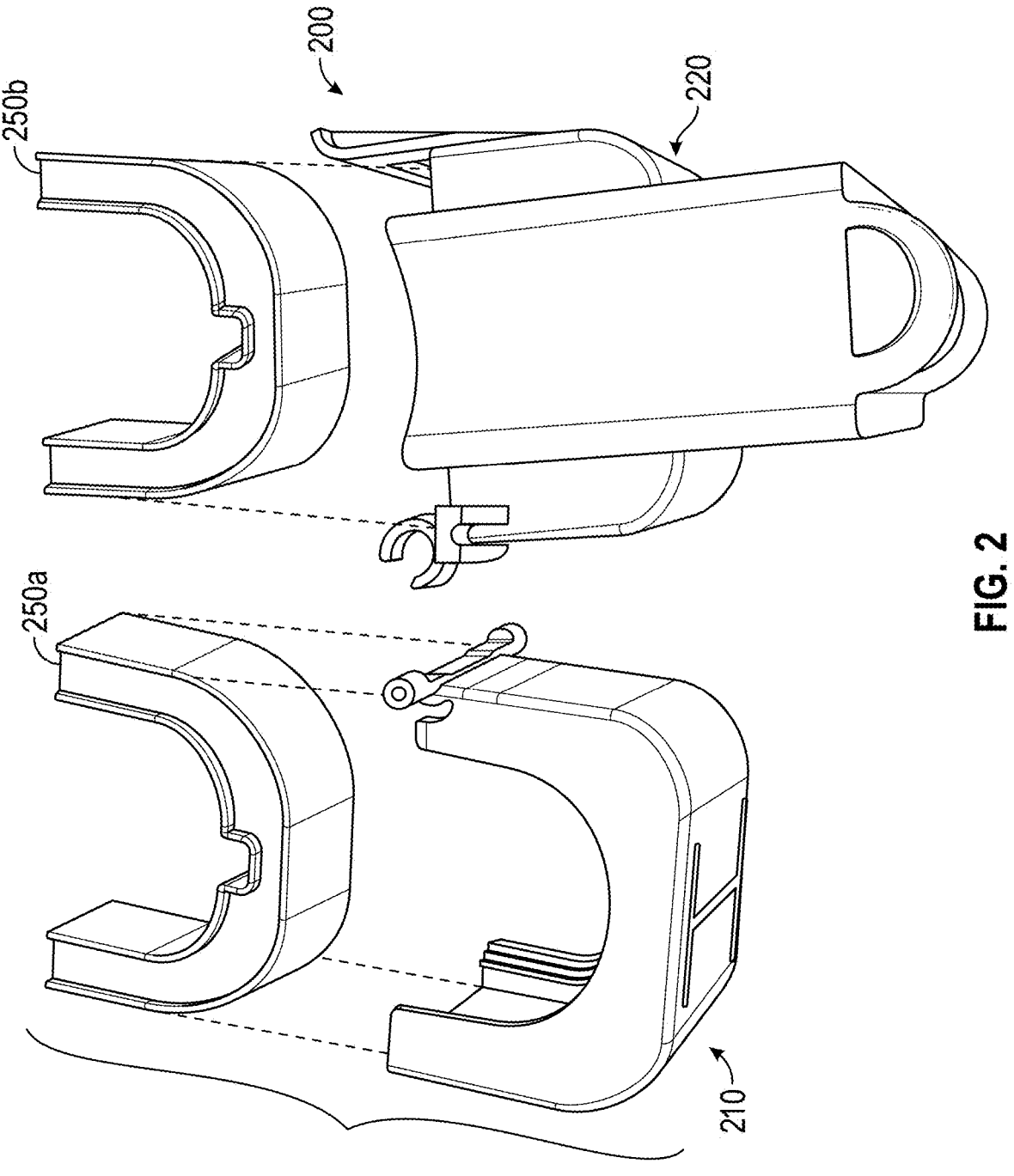
FIG. 2 is an exploded view of a housing of a split-core current transformer, according to one embodiment.

FIG. 2 is an exploded view of a housing 200 of a split-core current transformer, according to one embodiment. The split-core current transformer is an example of a current-monitoring device. The housing 200 includes a first housing part 210 and a second housing part 220 shown separated from each other. Each housing part 210, 220 is configured to house a core half 250a, 250b, respectively, of the split-core current transformer. The housing parts 210, 220 and respective core halves 250a, 250b are configured to encircle, encompass, be clipped around or otherwise clamped or interfaced to a monitored energy source. The current transformer can conduct a fluctuating magnetic field from a fluctuating flow of electrical current in the monitored energy source. The fluctuating magnetic field within the current transformer can in turn conduct an electromotive force within a wire to produce electrical energy. The wire is generally wrapped around one of the core halves 250a, 250b. From a sample or measurement of the current in the wire, a measurement of the fluctuating flow of electrical current in the monitored energy source can be inferred or otherwise determined. The housing 200 can also house processing circuitry and transmission circuitry of a current monitoring device. The processing circuitry may operate to collect samples (measurements) from the split core current transformer and otherwise determine a primary current in the monitored energy source. The transmission circuitry can transmit data, including measurements of the monitored energy source.

As can be appreciated, a split-core current transformer is one type of current-monitoring device. Other types of monitoring devices may be utilized and/or may otherwise implement embodiments of the disclosed tuning devices and methods. These other types of monitoring devices may include voltage monitoring devices and other devices to monitor and/or measure characteristics of electricity.

Figure 3:
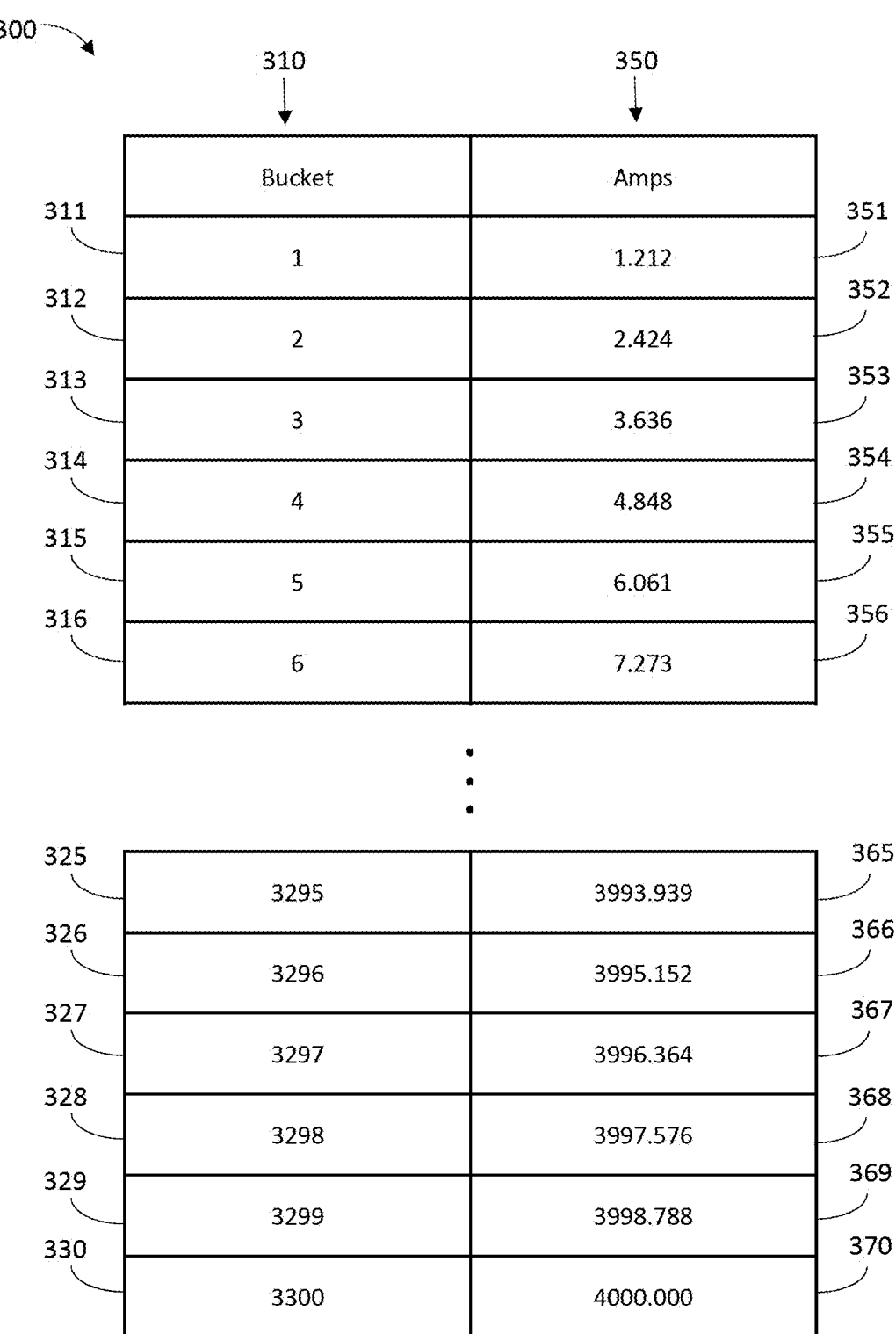
FIG. 3 is an example lookup table (LUT) associated with an analog-digital converter (ADC) of a self-tuning current-monitoring device, according to one embodiment.

FIG. 3 is an example lookup table (LUT) 300 associated with an analog-digital converter (ADC) of a self-tuning current-monitoring device. The current-monitoring device may be the split-core current transformer of FIG. 2 or one of the devices 110a-k of FIG. 1. The current-monitoring device may output analog readings of current in a monitored conductor. The ADC may convert the analog current readings to digital values, where the digital values represent buckets or slots of the ADC. The LUT 300 may describe associations between the buckets of the ADC and electrical current measurement values. In some embodiments, the LUT 300 may be stored in a memory of the ADC and an ADC output may be measurement values 350 or otherwise based on the LUT 300. In other embodiments, the LUT 300 may be stored in a memory of the current-monitoring device. The ADC output may include a designation of a bucket from a set of buckets 310 (or slots) of the LUT 300 and the LUT 300 may be used (e.g., by the current-monitoring device, or a destination/receiving system) to convert a designated bucket 310 output by the ADC to a corresponding measurement value 350 of the LUT. The LUT 300 may include the buckets 310 (or slots) and the measurement values 350. The buckets 310 may represent digital values corresponding to the measurement values 350. Each bucket may represent a range of values. For example, all analog current readings between 0 and 1.212 amps may be represented by a first bucket 311. In an example, the current-monitoring device outputs an analog current reading of 2.21592 amps. The ADC receives the reading of 2.21592 amps and outputs a digital value of 2, corresponding to a second bucket 312 of the buckets 310. The LUT 300 may indicate that the second bucket 312 is associated with a second measurement value 352 of 2.424 amps. Thus, in this example, the reading of 2.21592 amps from the current-monitoring device is converted into the second measurement value 352 of 2.424 amps by the ADC and the LUT 300.

The buckets 310 may include the first bucket 311, the second bucket 312, a third bucket 313, a fourth bucket 314, a fifth bucket 315, and a sixth bucket 316. The buckets 310 may include sequential buckets up to a last bucket 330. In some embodiments, the buckets 310 may include three thousand three hundred buckets, as shown. In other embodiments, the buckets 310 may include any number of buckets. In yet other embodiments, the buckets 310 may include a number of buckets equal to a capacity of the ADC.

Each bucket of the buckets 310 may be associated with a measurement value of the measurement values 350. The measurement values 350 may be associated with the buckets 310 based on a gain of the ADC. For example, the buckets 310 may be associated with the measurement values 350 based on a gain multiplier. In an example, the gain multiplier is 1.212, and each successive bucket is associated with a measurement value 1.212 amps higher than a previous bucket. The gain may be determined by a range of the measurement values 350. A last measurement value 370 may represent an upper limit of the range of the measurement values 350. The measurement values 350 may be evenly spaced, such that a difference between subsequent measurement values is equal to the range of the measurement values 350 divided by the number of buckets of the buckets 310. For example, if the range of the measurement values 350 is 4000 amps and the number of buckets is 3300, then a spacing between subsequent measurement values is equal to 4000 amps/3300, or 1.212 amps. The range of the measurement values 350 may be set based on an expected application of the current-monitoring device. For example, the range may be 4000 amps if the current monitoring device is expected to be used to measure current in a conductor having a rated capacity of 4000 amps.

The measurement values 350 may be changeable, such that different measurement values 350 are associated with the buckets 310. For example, the gain of the ADC may be adjusted such that different measurement values 350 are associated with the buckets 310.

Figure 4:
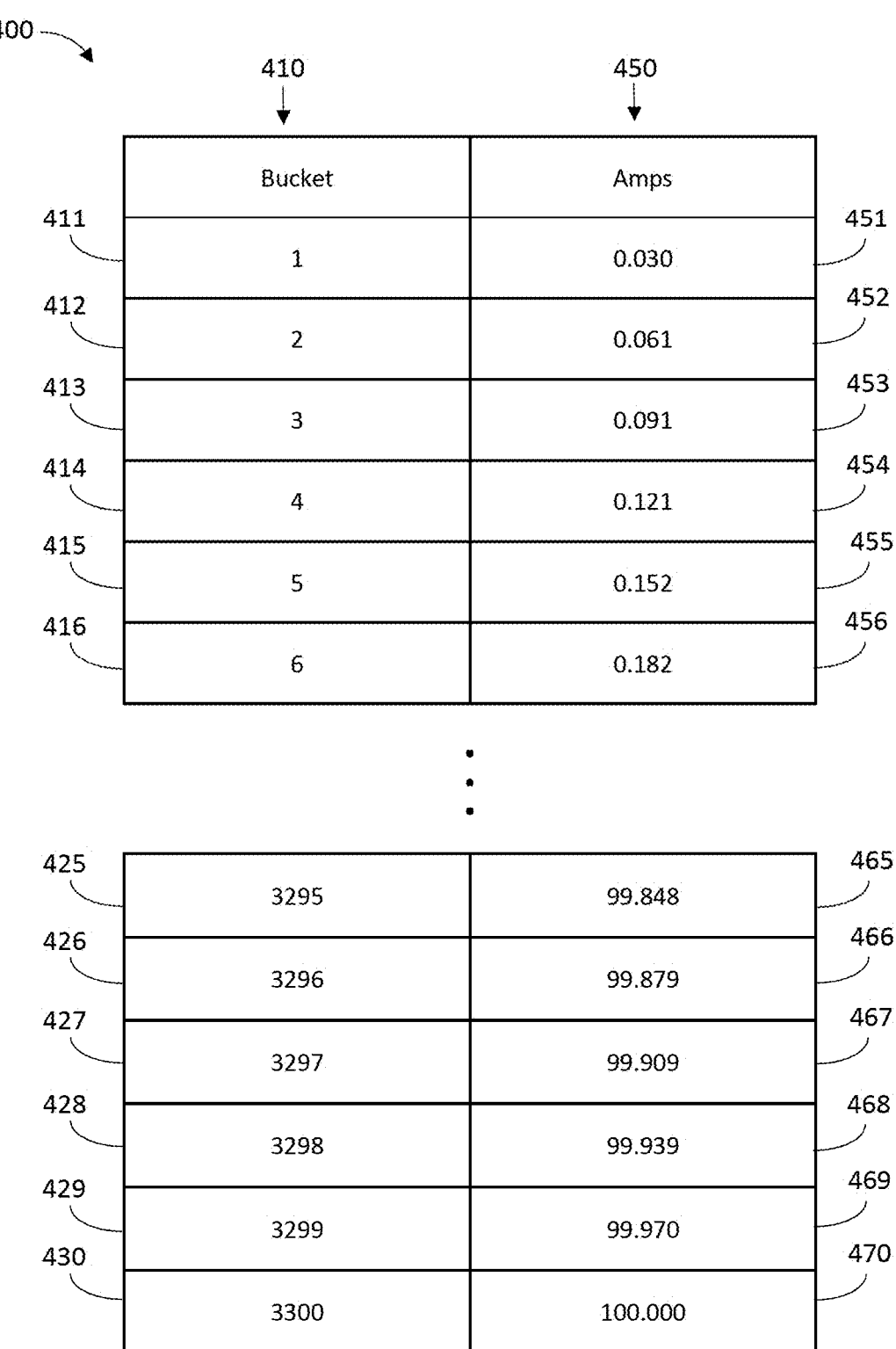
FIG. 4 is another example LUT associated with an analog-digital converter (ADC) of a self-tuning current-monitoring device, according to one embodiment.

FIG. 4 is an example LUT 400 associated with an analog-digital converter (ADC) of a self-tuning current-monitoring device. The current-monitoring device may be the split-core current transformer of FIG. 2 or one of the devices 110a-k of FIG. 1. In some embodiments, the LUT 400 may be the LUT 300 of FIG. 3, with an adjusted gain. The current-monitoring device may output analog readings of current in a monitored conductor. The ADC may convert the analog current readings to digital values, where the digital values represent buckets or slots of the ADC. The LUT 400 may describe associations between the buckets of the ADC and electrical current measurement values. In some embodiments, the LUT 400 may be stored in a memory of the ADC and an ADC output may be measurement values 450 or otherwise based on the LUT 400. In other embodiments, the LUT 400 may be stored in a memory of the current-monitoring device. The ADC output may include the buckets 410 and the LUT 400 may be used by the current-monitoring device to convert the buckets 410 to measurement values 450. The LUT 400 may include buckets 410 and measurement values 450. The buckets 410 may represent digital values corresponding to the measurement values 450. Each bucket may represent a range of values. For example, all analog current readings between 0 and 1.2120.030 amps may be represented by a first bucket 411.

The buckets 410 may include the first bucket 411, a second bucket 412, a third bucket 413, a fourth bucket 414, a fifth bucket 415, and a sixth bucket 416. The buckets 410 may include sequential buckets up to a last bucket 430. In some embodiments, the buckets 410 may include three thousand three hundred buckets, as shown. In other embodiments, the buckets 410 may include any number of buckets. In yet other embodiments, the buckets 410 may include a number of buckets equal to a capacity of the ADC.

Each bucket of the buckets 410 may be associated with a measurement value of the measurement values 450. The measurement values 450 may be associated with the buckets 410 based on a gain of the ADC. For example, the buckets 410 may be associated with the measurement values 450 based on a gain multiplier. In an example, the gain multiplier is 0.030, and each successive bucket is associated with a measurement value 0.030 amps higher than a previous bucket. The gain may be determined by a range of the measurement values 450. A last measurement value 470 may represent an upper limit of the range of the measurement values 450. The measurement values 450 may be evenly spaced, such that a difference between subsequent measurement values is equal to the range of the measurement values 450 divided by the number of buckets of the buckets 410. For example, if the range of the measurement values 450 is 100 amps and the number of buckets is 3300, then a spacing between subsequent measurement values is equal to 100 amps/3300, or 0.030 amps. The range of the measurement values 450 may be set based on an expected application of the current-monitoring device. For example, the range may be 100 amps if the current monitoring device is expected to be used to measure current in a conductor having a rated capacity of 100 amps.

The measurement values 450 may be changeable, such that different measurement values 450 are associated with the buckets 410. For example, the gain of the ADC may be adjusted such that different measurement values 450 are associated with the buckets 410. As noted above, the LUT 400 may be the LUT 300 of FIG. 3, with an adjusted gain. In some embodiments, the current-monitoring device may self-tune by adjusting the gain of the ADC. In some embodiments, the current-monitoring device may adjust the gain of the ADC to calculate new measurement values 450 using Equation 1, where $M_{new}$ is the new measurement values, $G_{adjusted}$ is the adjusted gain, and M is the measurement values 450.

$$M_{new} = G_{adjusted} * M \qquad \text{Equation 1}$$

In some embodiments, the current-monitoring device may adjust the gain of the ADC based on a standard deviation of analog current readings captured by the current-monitoring device. In other embodiments, the current-monitoring device may adjust the gain of the ADC based on a standard deviation of digital values output by the ADC corresponding to the readings. In some embodiments, the current-monitoring device may adjust the gain of the ADC to be proportional to a multiple of the standard deviation. For example, the current monitoring device may detect analog current readings and the ADC may convert the analog current readings into digital values, and determine a standard deviation of the digital values. In some embodiments, the ADC may convert the digital values into measurement values using the LUT 300 of FIG. 3 and determine a standard deviation of the measurement values. The current monitoring device may adjust the gain of the ADC and may correspondingly adjust the gain of the LUT 300 of FIG. 3 based on the standard deviation to obtain the LUT 400.

In some embodiments, the current-monitoring device may adjust the gain of the ADC based on an average of the readings captured by the current-monitoring device. In some embodiments, the current-monitoring device may adjust the gain of the ADC to center the LUT 400 on the average of the captured readings. In some embodiments, the current-monitoring device may adjust the gain of the ADC to calculate new measurement values 450 as in Equation 2, where $M_{new}$ is the new measurement values, $G_{adjusted}$ is the adjusted gain, M is the measurement values 450, and C is a constant.

$$M_{new} = G_{adjusted} * M + C \qquad \text{Equation 2}$$

In some embodiments, a first measurement value 451 may include zero amps and a second measurement value 452 may be adjusted upwards such that the LUT 400 is centered on the average and the measurement values 450 are evenly spaced, with the exception of the first measurement value 451 and the second measurement value 452. In other embodiments, the first measurement value 451 may be adjusted upwards such that the LUT 400 is centered on the average and the measurement values 450 are evenly spaced. In some embodiments, the current-monitoring device may adjust the gain of the ADC based on the average and standard deviation of the captured measurements. For example, the current-monitoring device may adjust the gain of the ADC to center the LUT 400 on the average with a range sufficient to cover multiple standard deviations from the average. For example, the current-monitoring device may adjust the gain of the ADC to center the LUT 400 on 50 amps with a range equal to six times the standard deviation. This range allows the ADC to measure current values three standard deviations above the mean and current values three standard deviations below the mean.

Self-tuning may allow the current-monitoring device to be used to accurately measure current for a variety of different conductors having different rated capacities. For example, the current-monitoring device may be intended for use with a conductor having a rated capacity of 4000 amps, but the current-monitoring device may be coupled to (e.g., utilized to monitor) a conductor having a rated capacity of 100 amps. Using a range of 4000 amps for the ADC would result in coarse readings of current. The current-monitoring device may adjust the gain of the ADC to self-tune for use with the conductor having the rated capacity of 100 amps. The adjusted range of the ADC granted by the adjusted gain may allow for precise measurement of current in the conductor having the rated capacity of 100 amps.

The current-monitoring device may transmit a signal or digital transmission/communication to a server, such as the server system 142 of FIG. 1. The signal may include indications of the buckets 410. The server may include the LUT 400 such that the server can decode the indications of the buckets 410 to determine the measurement values 450. For example, the signal may include an indication of the fifth bucket 415 corresponding to a fifth measurement value 455 representing a range of values between 0.121 amps and 0.152 amps. The server may include the LUT 400 such that the server can decode the indication of the fifth bucket 415 to determine that the current-monitoring device read a current between 0.121 amps and 0.152 amps. The signal (or digital transmission/communication) may include the adjusted gain of the ADC. The server may apply the adjusted gain of the ADC to the server's lookup table 400 such that the server's LUT 400 matches the current-monitoring device's LUT 400. In some embodiments, the current-monitoring device waits for an acknowledgment from the server of the adjusted gain before adjusting the gain of the ADC. In some embodiments, each signal (or digital transmission/communication) sent to the server includes an indication of the gain used. In other embodiments, each signal (or digital transmission/communication) sent to the server with an adjusted gain includes an indication of the gain used.

In some embodiments, the current-monitoring device may periodically or continuously determine a new standard deviation of the readings, digital values, or measurement values. The current-monitoring device may update the adjusted gain of the ADC based on the new standard deviation. In some embodiments, the current-monitoring device may update the adjusted gain only if the new standard deviation is outside of a standard-deviation threshold.

In some embodiments, the server may be configured to determine the standard deviation and/or average and adjust the gain accordingly, as described in conjunction with the current-monitoring device. The server may transmit a signal (or digital transmission/communication) to the current-monitoring device to adjust the gain. In some embodiments, the server may wait for an acknowledgement of the adjusted gain from the current-monitoring device.

Figure 5:
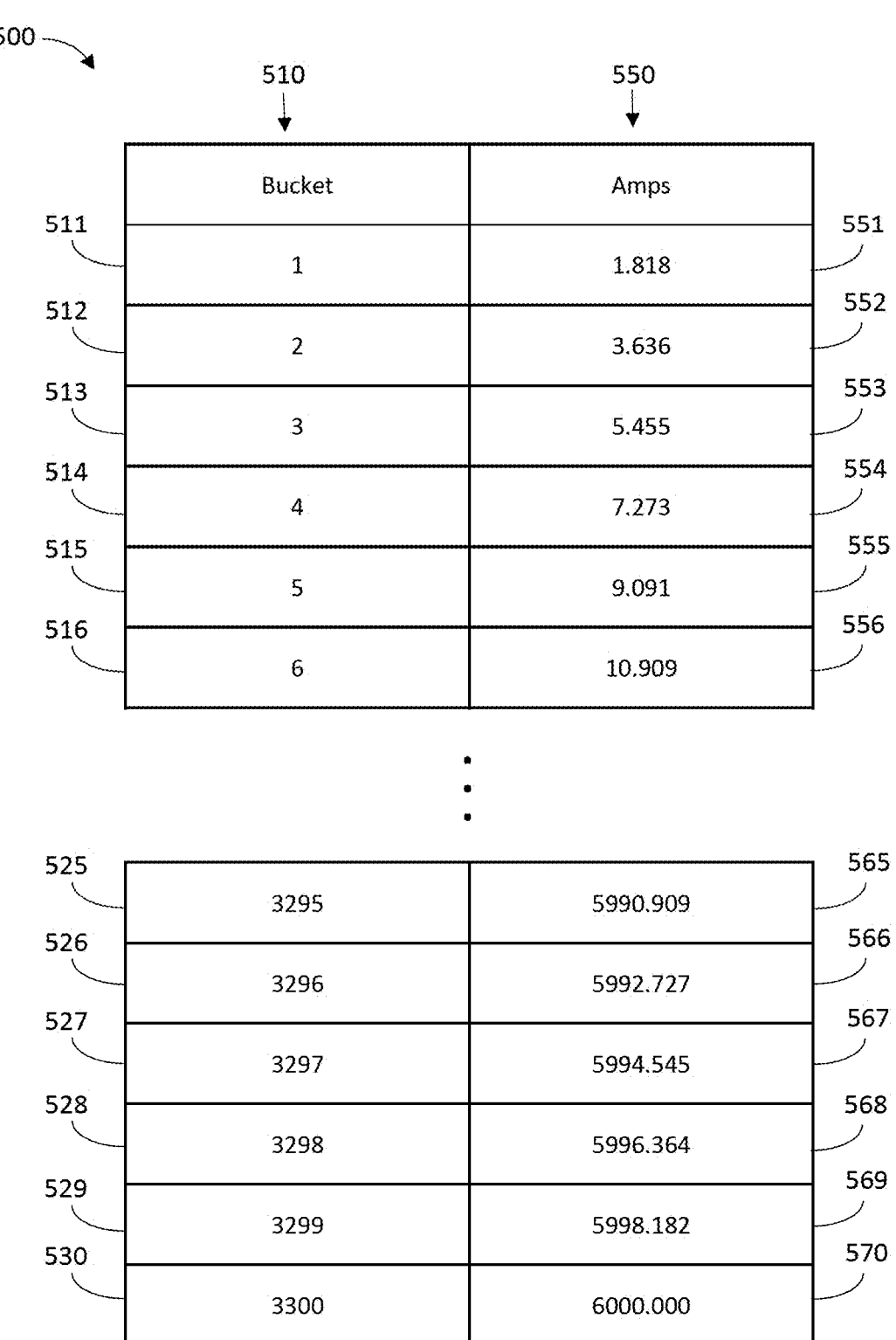
FIG. 5 is yet another example LUT associated with an analog-digital converter (ADC) of a self-tuning current-monitoring device, according to one embodiment.

FIG. 5 is an example LUT 500 of or otherwise associated with an analog-digital converter (ADC) of a self-tuning current-monitoring device. The current-monitoring device may be the split-core current transformer of FIG. 2 or one of the devices 110a-k of FIG. 1. In some embodiments, the LUT 500 may be the LUT 300 of FIG. 3 and/or the LUT 400 of FIG. 4, with an adjusted gain. The LUT 500 may have a gain adjusted upwards to accommodate a greater range of measurement values 550. The current-monitoring device may output analog readings of current in a monitored conductor. The ADC may convert the analog current readings to digital values, where the digital values represent buckets or slots of the ADC. The LUT 500 may describe associations between the buckets of the ADC and electrical current measurement values. In some embodiments, the LUT 500 may be stored in a memory of the ADC and an ADC output may be measurement values 550 or otherwise based on the LUT 500. In other embodiments, the LUT 500 may be stored in a memory of the current-monitoring device. The ADC output may include the buckets 510 and the LUT 500 may be used by the current-monitoring device to convert the buckets 510 to measurement values 550.

Figure 6:
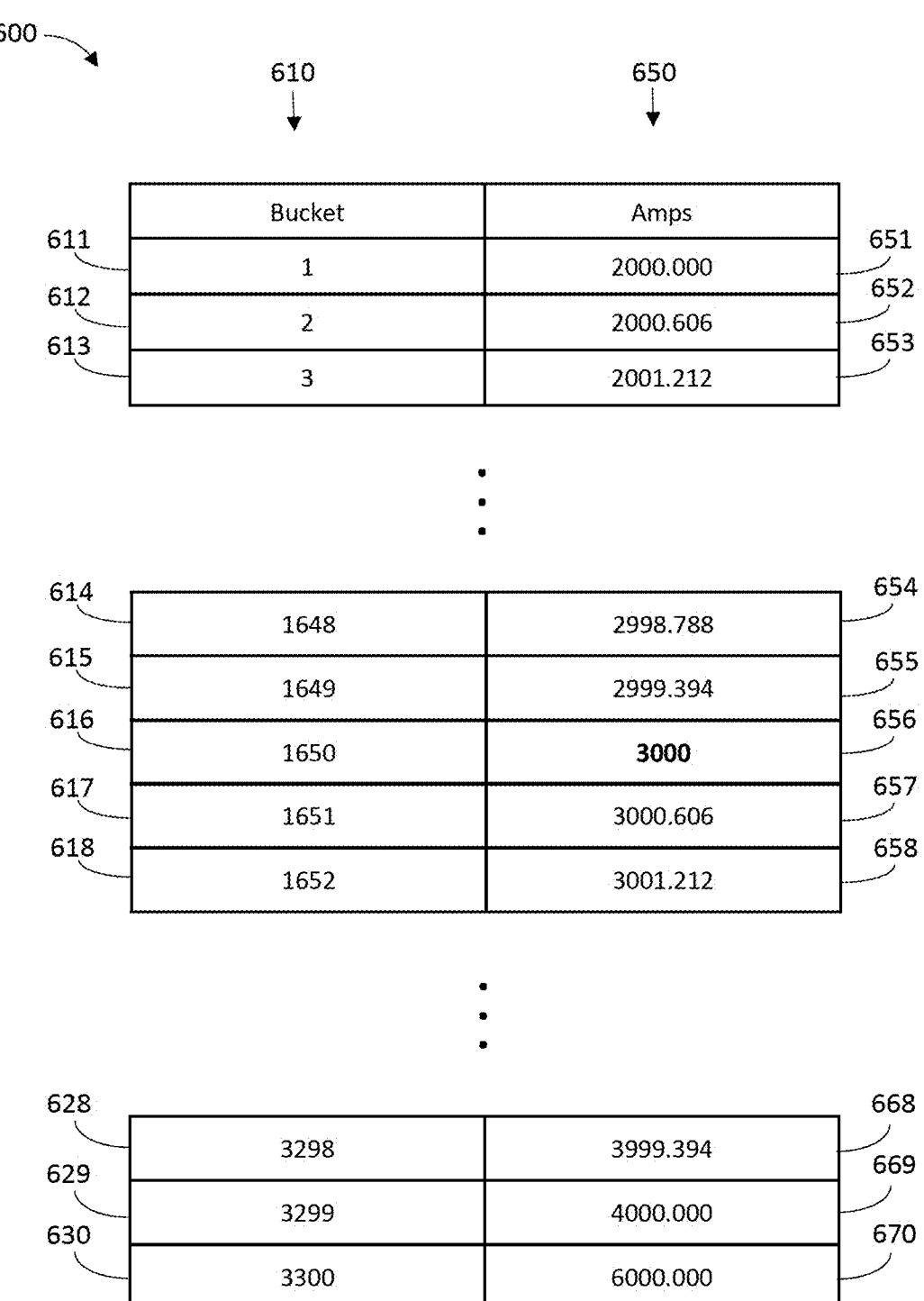
FIG. 6 is an example LUT centered on a mean current reading and associated with an ADC of a self-tuning current-monitoring device.

FIG. 6 is an example LUT 600 centered on a mean current reading and associated with an ADC of a self-tuning current-monitoring device. The current-monitoring device may be the split-core current transformer of FIG. 2 or one of the devices 110a-k of FIG. 1. In some embodiments, the LUT 600 may be the LUT 300 of FIG. 3 and/or the LUT 400 of FIG. 4, with an adjusted gain. The current-monitoring device may output analog readings of current in a monitored conductor. The ADC may convert the analog current readings to digital values, where the digital values represent buckets or slots of the ADC. The LUT 600 may describe associations between the buckets of the ADC and electrical current measurement values. The LUT 600 may be centered on a mean current measurement, as discussed herein. The LUT 600 may correspond to an adjusted gain of the ADC as calculated using Equation 2. The LUT 600 may be centered on a mean measurement value 656. The mean measurement value 656 may be a mean of measurement values captured in a particular time period. In some embodiments, the mean measurement value 656 is a mean of measurement values captured in a day, minute, hour, or other time period immediately preceding the centering of the LUT 600. In other embodiments, the mean measurement value 656 is a rolling mean of measurement values.

The LUT 600 may include buckets 610 and measurement values 650. The buckets 610 may correspond to an output of the ADC and the measurement values 650 may correspond to analog current readings of the ADC associated with the buckets 610. For example, the current-monitoring device may read a current of 2000.010 amps corresponding to a second bucket 612 of the buckets 610. The LUT 600 may convert the second bucket 612 to a second measurement value 652 of the measurement values 650 of 2000.606 amps. The second measurement value 652 of 2000.606 amps may represent all current values between 2000.000 and 2000.606 amps.

The measurement values 650 may include equal numbers of measurement values above and below the mean measurement value 656. The measurement values 650 may be equally spaced. The mean measurement value 656 of the LUT 600 may be 3000 amps. In some embodiments, the buckets 610 may include three thousand three hundred buckets, as shown. In other embodiments, the buckets 610 may include any number of buckets. In yet other embodiments, the buckets 610 may include a number of buckets equal to a capacity of the ADC. In some embodiments, the buckets 610 may include an even number of buckets, as shown meaning that the measurement values 650 cannot be evenly centered around the mean measurement value 656. In some embodiments, an additional measurement value may be included above the mean measurement value 656, as shown. For example, a maximum measurement value 670 may be 6000 amps, above the mean measurement value 656 of 3000 amps and breaking the pattern of evenly spaced measurement values. In other embodiments, an additional measurement value may be included below the mean measurement value 656. For example, a minimum measurement value may be 0 amps, below the mean measurement value 656 and breaking the pattern of evenly spaced measurement values.

The range of the LUT 600 may be based on a standard deviation of current measurements. The range of the LUT 600 may be a multiple of the standard deviation. For example, the range of the LUT 600 may be equal to four of the standard deviations, including measurements two standard deviations above the mean measurement value 656 and two standard deviations below the mean measurement value 656. Adjusting a gain of the ADC such that the range of the LUT 600 is limited to a multiple of the standard deviation provides the measurement values 650 with a level of granularity corresponding to expected current measurements.

Figure 7:
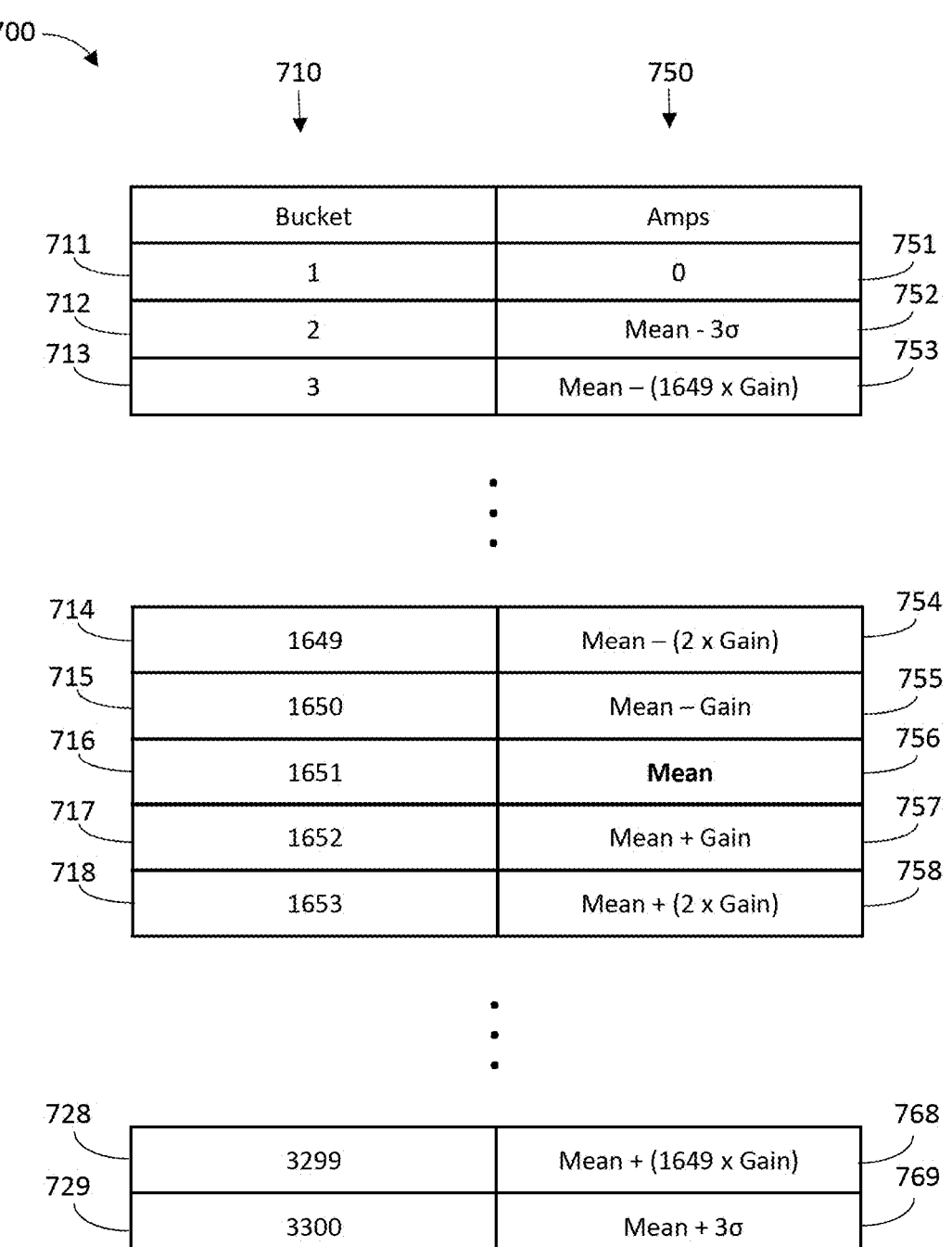
FIG. 7 is another example LUT centered on a mean current reading and associated with an ADC of a self-tuning current-monitoring device.

FIG. 7 is another example LUT centered on a mean current reading and associated with an ADC of a self-tuning current-monitoring device. The current-monitoring device may be the split-core current transformer of FIG. 2 or one of the devices 110a-k of FIG. 1. In some embodiments, the LUT 700 may be the LUT 300 of FIG. 3 and/or the LUT 400 of FIG. 4, with an adjusted gain. The LUT 700 may be centered on a mean current measurement, as discussed herein. The current-monitoring device may output analog readings of current in a monitored conductor. The ADC may convert the analog current readings to digital values, where the digital values represent buckets or slots of the ADC. The LUT 700 may describe associations between the buckets of the ADC and electrical current measurement values. The LUT 700 may correspond to an adjusted gain of the ADC as calculated using Equation 2. The LUT 700 may be centered on a mean measurement value 756. The mean measurement value 756 may be a mean of measurement values captured in a particular time period. In some embodiments, the mean measurement value 756 is a mean of measurement values captured in a day, minute, hour, or other time period immediately preceding the centering of the LUT 700. In other embodiments, the mean measurement value 756 is a rolling mean of measurement values.

The LUT 700 may include buckets 710 and measurement values 750. The buckets 710 may correspond to an output of the ADC and the measurement values 750 may correspond to analog current readings of the ADC associated with the buckets 710. The measurement values 750 may include equal numbers of measurement values above and below the mean measurement value 756. The measurement values 750 may be equally spaced. The mean measurement value 756 of the LUT 700 may be 3000 amps. In some embodiments, the buckets 710 may include three thousand three hundred buckets, as shown. In other embodiments, the buckets 710 may include any number of buckets. In yet other embodiments, the buckets 710 may include a number of buckets equal to a capacity of the ADC. In some embodiments, the buckets 710 may include an even number of buckets, as shown, meaning that the measurement values 750 cannot be evenly centered around the mean measurement value 756. In some embodiments, an additional measurement value may be included above the mean measurement value 756. In other embodiments, an additional measurement value may be included below the mean measurement value 756, as shown. For example, a minimum measurement value may be 0 amps, below the mean measurement value 756 and breaking the pattern of evenly spaced measurement values.

The range of the LUT 700 may be based on a standard deviation of current measurements. The range of the LUT 700 may be a multiple of the standard deviation. For example, the range of the LUT 700 may be equal to six of the standard deviations, including measurements three standard deviations above the mean measurement value 756 and three standard deviations below the mean measurement value 756. A first measurement value below mean 755 may be equal to the mean measurement value 756 minus the gain. A second measurement value below mean 754 may be equal to the mean measurement value 756 minus two times the gain. A third measurement value 753 may be equal to the mean measurement value 756 minus one thousand six hundred and forty nine times the gain. The number multiplied by the gain depends on a number of the buckets 710 which may depend upon the capacity of the ADC, as discussed herein. A second measurement value 752 may be equal to the mean measurement value 756 minus three times the standard deviation which is equal to the mean measurement value 756 minus one thousand six hundred and fifty times the gain. The gain is adjusted such that the LUT 700 includes measurement values three standard deviations above and below the mean, such that the second measurement value 752 is equal to the mean measurement value 756 minus three times the standard deviation which is equal to the mean measurement value 756 minus one thousand six hundred and fifty times the gain, where there are 3300 buckets total and a first measurement value 751 is equal to zero. The measurement values above the mean measurement value 756 follow the same pattern in reverse. A first measurement value above mean 757 may be equal to the mean measurement value 756 plus the gain. A second measurement value above mean 758 may be equal to the mean measurement value 756 plus two times the gain. A maximum measurement value 769 may be equal to the mean plus three times the standard deviation which is equal to the mean measurement value 756 plus one thousand six hundred and fifty times the gain, where there are 3300 buckets total and the first measurement value 751 is equal to zero.

Adjusting a gain of the ADC such that the range of the LUT 700 is limited to a multiple of the standard deviation provides the measurement values 750 with a level of granularity corresponding to expected current measurements. Adjusting the gain such that the LUT 700 is centered on the mean measurement value 756 allows the measurement values 750 to be more closely spaced by eliminating measurement values below the mean measurement value 756 which are unlikely to be measured.

Figure 8:
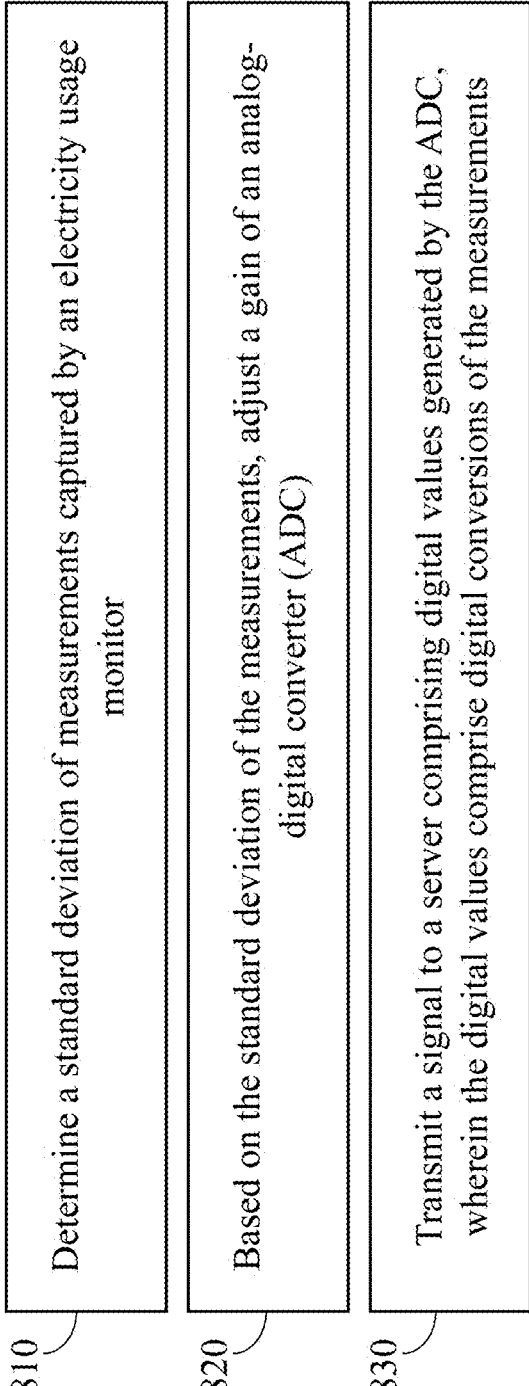
FIG. 8 is a flowchart illustrating a process for adjusting a gain of an analog-digital converter (ADC) of an electricity usage monitor, according to one embodiment.

FIG. 8 is a flowchart illustrating a process 800 for adjusting a gain of an analog-digital converter (ADC) of an electricity usage monitor. Additional, fewer, or different steps may be included in the process 800. The steps shown may be performed concurrently or in a different order. The process 800 may be performed by an electricity usage monitor, such as the electricity monitoring devices 110 of FIG. 1, the split-core current transformer discussed in conjunction with FIG. 2, or the self-tuning current-monitoring device discussed in conjunction with FIGS. 3-5.

A processor of the electricity usage monitor determines 810 a standard deviation of measurements captured by the electricity usage monitor. In some embodiments, the electricity usage monitor may be coupled to a conductor and may measure a current of the conductor.

The processor, based on the standard deviation of the measurements, adjusts 820 a gain of an analog-digital converter (ADC) of the electricity usage monitor. In some embodiments, adjusting the gain may include adjusting the gain to be equal to a multiple of the standard deviation. In some embodiments, adjusting the gain may include adjusting the gain such that a look-up table (LUT) of the ADC is centered on an average of the measurements.

The processor transmits 830 a signal to a server comprising digital values generated by the ADC, wherein the digital values include digital conversions of the measurements. In some embodiments, the digital values are buckets of the ADC associated with measurements or ranges of measurements of electrical values. In some embodiments, the signal includes the adjusted gain of the ADC. In some embodiments, the electricity usage monitor waits for an acknowledgement of the adjusted gain from the server before adjusting the gain. In some embodiments, the server includes an LUT matching the LUT of the ADC such that the server can decode the buckets of the ADC to obtain the measurements.

FIG. 9 is a flowchart illustrating a process 900 for monitoring electricity, according to an embodiment. Additional, fewer, or different steps may be included in the process 900. The steps shown may be performed concurrently or in a different order. The process 900 may be performed by a server system configured to communicate with an electricity usage monitor The server system can receive 910, from an electricity usage monitor, a digital communication comprising readings captured by the electricity usage monitor converted into digital values by the ADC of the electricity usage monitor.

The server receives 920 an adjusted gain of the ADC. The server system can update 930 based on the adjusted gain of the ADC. The server system. The server system can decode 940 the digital values based on the adjusted gain.

FIG. 10 is a flowchart illustrating a process 1000 for adjusting a gain of an ADC of an electricity usage monitor, according to another embodiment. Additional, fewer, or different steps may be included in the process 1000. The steps shown may be performed concurrently or in a different order. The process 1000 may be performed by a server system configured to communicate with an electricity usage monitor.

The server system can receive 1010, from an electricity usage monitor, a digital communication comprising a plurality of readings captured by the electricity usage monitor converted into digital values by an analog-digital converter (ADC) of the electricity usage monitor. The server system can determine 1020 a standard deviation of the plurality of readings, based on the digital values. The server system can adjust 1030 a gain of the ADC based on the standard deviation. The server system can transmit 1040, to the electricity usage monitor, the adjusted gain of the ADC.

EXAMPLES

Some examples of embodiments of the present disclosure are provided below.

Example 1. An electricity usage monitor including a coupling component to attach the electricity usage monitor to an electrical circuit to monitor electricity usage of the electrical circuit, an analog-digital converter (ADC) configured to convert readings captured by the electricity usage monitor into digital values, a network communication interface, a processor operably coupled to the ADC, and a non-transitory, computer-readable medium operably coupled to the processor and including instructions which, when executed by the processor, cause the processor to determine a standard deviation of the measurements, based on the standard deviation, adjust a gain of the ADC, and transmit, by the communication interface, a signal or digital communication (e.g. to a server) including the digital values.

Example 2. The electricity usage monitor of example 1, wherein adjusting the gain of the ADC includes adjusting the gain to be proportional to a multiple of the standard deviation.

Example 3. The electricity usage monitor of example 1, wherein adjusting the gain of the ADC includes adjusting the gain based on an average of the measurements.

Example 4. The electricity usage monitor of example 3, wherein the signal (e.g., to the server) includes the adjusted gain of the ADC.

Example 5. The electricity usage monitor of example 4, wherein the instructions further cause the processor to receive an acknowledgement of the adjusted gain (e.g., from the server) before adjusting the gain.

Example 6. The electricity usage monitor of example 5, wherein the signal includes ADC buckets associated with the digital values.

Example 7. The electricity usage monitor of example 1, wherein the instructions further cause the processor to determine a new standard deviation of the measurements, and based on the new standard deviation, update the adjusted gain of the ADC.

Example 8. A non-transitory, computer-readable medium operably coupled to one or more processors and including instructions that, when executed by the one or more processors, cause the one or more processors to determine a standard deviation of readings captured by an electricity usage monitor, based on the standard deviation of the readings, adjust a gain of an analog-digital converter (ADC), and transmit a signal or digital transmission (e.g., to a server) including digital values generated by the ADC, wherein the digital values include digital conversions of the readings.

Example 9. The medium of example 8, wherein adjusting the gain of the ADC includes adjusting the gain to be proportional to a multiple of the standard deviation of the readings.

Example 10. The medium of example 8, wherein adjusting the gain of the ADC includes adjusting the gain based on an average of the readings.

Example 11. The medium of example 10, wherein the signal or digital transmission (e.g., to the server) includes the adjusted gain of the ADC.

Example 12. The medium of example 11, wherein the instructions further cause the processor to receive an acknowledgement of the adjusted gain (e.g., from the server) before adjusting the gain.

Example 13. The medium of example 12, wherein the signal includes ADC buckets associated with the digital values.

Example 14. The medium of example 8, wherein the instructions further cause the processor to determine a new standard deviation of the measurements, and based on the new standard deviation, update the adjusted gain of the ADC.

Example 15. A system including a server including one or more processors to receive, by the server, from an electricity usage monitor, a signal including digital values including digital conversions of readings captured by the electricity usage monitor, wherein the readings are converted into the digital values by an analog-digital converter (ADC) of the electricity usage monitor, receive, by the server, from the electricity usage monitor, a gain of the ADC, and based on a standard deviation of the readings, transmit a signal to the electricity usage monitor to adjust the gain of the ADC.

Example 16. The system of example 15, wherein adjusting the gain of the ADC includes adjusting the gain to be proportional to a multiple of the standard deviation of the readings.

Example 17. The system of example 15, wherein adjusting the gain of the ADC includes adjusting the gain based on an average of the readings.

Example 18. The system of example 17, wherein the one or more processors receive, from the electricity usage monitor, an acknowledgement of the adjusted gain.

Example 19. The system of example 15, wherein the digital values include ADC buckets associated with electrical readings.

Example 20. The system of example 19, wherein the one or more processors decode the digital values using the adjusted gain.

Example 21. The system of example 15, wherein the one or more processors determine a new standard deviation of the readings, and based on the new standard deviation, update the adjusted gain of the ADC.

Example 22. A method of electricity usage monitoring comprising: acquiring or otherwise receiving a plurality of readings captured by an electricity usage monitor; converting, by an analog-digital converter (ADC) of the electricity usage monitor, the plurality of readings to digital values; determining a standard deviation of the plurality of readings captured by an electricity usage monitor, based on the digital values; based on the standard deviation, adjusting a gain of the ADC; and transmitting a digital communication comprising the digital values.

Example 23. The method of Example 22, wherein adjusting the gain of the ADC comprises adjusting the gain to be proportional to a multiple of the standard deviation of the digital values.

Example 24. The method of Example 22, wherein adjusting the gain of the ADC comprises adjusting the gain based on an average of the digital values.

Example 25. The method of Example 24, wherein the digital communication comprises the adjusted gain of the ADC.

Example 26. The method of Example 25, further comprising: receiving an acknowledgement of the adjusted gain before adjusting the gain.

Example 27. The method of Example 26, wherein the digital communication further comprises ADC buckets associated with the digital values.

Example 28. The method of Example 22, further comprising: determining a new standard deviation of the plurality of readings; and based on the new standard deviation, updating the adjusted gain of the ADC.

It will be obvious to those having skill in the art that many changes may be made to the details of the above-described embodiments without departing from the underlying principles of the invention. The scope of the present invention should, therefore, be determined only by the following claims.

What is claimed is:

1. A method of electricity usage monitoring, comprising:
   receiving a plurality of readings captured by an electricity usage monitor;
   converting, by an analog-digital converter (ADC) of the electricity usage monitor, the plurality of readings to digital values;
   determining a standard deviation of the plurality of readings captured by the electricity usage monitor, based on the digital values;
   adjusting a gain of the ADC based on the standard deviation; and
   transmitting a digital communication comprising the digital values and the adjusted gain of the ADC.

2. The method of claim 1, wherein the gain of the ADC is adjusted to be proportional to a multiple of the standard deviation of the digital values.

3. The method of claim 1, wherein adjusting the gain of the ADC comprises adjusting the gain based on an average of the digital values.

4. The method of claim 1, further comprising decoding the digital values using the adjusted gain of the ADC.

5. The method of claim 4, further comprising receiving an acknowledgement indicating that the gain was adjusted at a remote computing device based on the standard deviation before the adjusting the gain of the ADC at the electricity usage monitor.

6. The method of claim 5, wherein the digital communication further comprises ADC buckets associated with the digital values.

7. The method of claim 1, further comprising:
   determining a new standard deviation of the plurality of readings; and based on the new standard deviation, updating the adjusted gain of the ADC.

8. The method of claim 1, further comprising:
   determining a difference between the standard deviation and a standard deviation threshold; and
   updating the adjusted gain of the ADC based on the difference.

9. A method of electricity usage monitoring comprising:
   receiving, by a server system, from an electricity usage monitor, a digital communication comprising readings captured by the electricity usage monitor converted into digital values by an analog-digital converter (ADC) of the electricity usage monitor;
   receiving, by the server system, an adjusted gain of the ADC;
   updating the server system based on the adjusted gain of the ADC; and
   decoding, by the server system, the digital values based on the adjusted gain.

10. The method of claim 9, wherein the electricity usage monitor utilizes a first lookup table for converting the readings into digital values.

11. The method of claim 10, wherein the first lookup table is based on the adjusted gain of the ADC.

12. The method of claim 10, wherein the server system stores a second lookup table.

13. The method of claim 12, wherein updating the server system comprises adjusting the second lookup table based on the digital communication, such that the second lookup table matches the first lookup table.

14. The method of claim 12, wherein the first lookup table and the second lookup table comprise ADC buckets associated with the digital values.

15. The method of claim 12, wherein decoding the digital values comprises referencing the second lookup table to determine measurement values.

16. The method of claim 9, further comprising:
   transmitting, by the server system, an acknowledgement of the adjusted gain of the ADC.

17. The method of claim 9, wherein the adjusted gain of the ADC is proportional to a multiple of a standard deviation of the digital values.

18. A method of electricity usage monitoring comprising:
   receiving, by a server system, from an electricity usage monitor, a digital communication comprising a plurality of readings captured by the electricity usage monitor converted into digital values by an analog-digital converter (ADC) of the electricity usage monitor;
   determining a standard deviation of the plurality of readings, based on the digital values;
   adjusting a gain of the ADC based on the standard deviation; and
   transmitting, to the electricity usage monitor, the adjusted gain of the ADC.

19. The method of claim 18, further comprising decoding, by the server system, the digital values using the adjusted gain of the ADC.

20. The method of claim 18, further comprising receiving an acknowledgement indicating that the gain has been adjusted at a remote computing device based on the standard deviation before the adjusting the gain of the ADC at the server system.

* * * * *